(12) United States Patent
Buck

(10) Patent No.: US 6,239,587 B1
(45) Date of Patent: May 29, 2001

(54) PROBE FOR MONITORING RADIO FREQUENCY VOLTAGE AND CURRENT

(75) Inventor: David W. Buck, Mesquite, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/001,815

(22) Filed: Dec. 31, 1997

Related U.S. Application Data

(60) Provisional application No. 60/034,582, filed on Jan. 3, 1997.

(51) Int. Cl.[7] .................................................. G01R 27/26
(52) U.S. Cl. ............................................. 324/95; 324/754
(58) Field of Search ............................... 324/754, 95, 72.5

(56) References Cited

U.S. PATENT DOCUMENTS

| | | | |
|---|---|---|---|
| 3,037,167 | * | 5/1962 | Hovda et al. ........................... 324/95 |
| 4,080,566 | * | 3/1978 | Mecklenburg ......................... 324/95 |
| 5,021,734 | * | 6/1991 | Tuttle ..................................... 324/537 |
| 5,467,013 | * | 11/1995 | Williams et al. ..................... 324/127 |
| 5,808,415 | * | 9/1998 | Hopkins ........................... 324/111.21 |
| 5,834,931 | * | 11/1998 | Moore et al. ........................... 324/95 |
| 5,867,020 | * | 2/1999 | Moore et al. ........................... 324/95 |

* cited by examiner

Primary Examiner—Safet Metjahic
Assistant Examiner—Vincent Q. Nguyen
(74) Attorney, Agent, or Firm—Mark A. Valetti; Wade James Brady, III; Frederick J. Telecky, Jr.

(57) ABSTRACT

A probe (10) has a main body (12), an input side (14) and an output side (16). The main body (12) has a cavity (17) to receive an insulator (18). The insulator (18) has a current slit (22) and a voltage slit (24) aligned with a first aperture (30a) and a second aperture (30b). An inner conductor extends through the insulator (18) from the input side (14) to the output side (42) of the main body (12). A current sensor (40) inserts into the first aperture (30a) and the current slit (22). A voltage sensor (50) inserts into the second aperture (30b) and the voltage slit (24). A radio frequency signal on a transmission line having a same impedance as the probe (10) enters the inner conductor (20) at the input side (14), induces a current onto the current sensor (40) and a voltage onto the voltage sensor (50). The induced current and voltage can be measured to monitor the characteristics of the transmission line.

15 Claims, 2 Drawing Sheets

PROBE FOR MONITORING RADIO FREQUENCY VOLTAGE AND CURRENT

This is a Non Provisional application filed under 35 USC 119(e) and claims priority of prior provisional, Serial No. 60/034,582 of inventor David W. Buck, filed Jan. 3, 1997.

TECHNICAL FIELD OF THE INVENTION

This invention relates to the field of current and voltage detectors, and more specifically to a probe for monitoring radio frequency voltage and current.

BACKGROUND OF THE INVENTION

Various electronic devices, including plasma processing tools used in the semiconductor industry, operate in the radio frequency (RF) band. In operation, these devices generate RF power. To effectively channel that RF power, information concerning its voltage, current, and phase are needed. While devices currently exist to measure the voltage, current, and phase in an RF system, they all suffer from one or more of the following drawbacks. First, these detectors have impedances which differ from the impedance in the transmission line. This results in poor readings due to reflections and power losses. Second, these detectors are typically large, cumbersome devices. Also, the designs are usually difficult to conveniently manufacture. Therefore, it is desirable to have a detector which avoids reflections and power losses due to impedance mismatching.

SUMMARY OF THE INVENTION

From the foregoing, it may be appreciated that a need has arisen for a device that matches an impedance of a transmission line in order to obtain accurate voltage, current, and phase measurements. In accordance with the present invention, a probe for monitoring radio frequency voltage and current is provided which substantially eliminates or reduces disadvantages and problems associated with prior radio frequency probes.

According to an embodiment of the present invention, there is provided a probe for monitoring radio frequency voltage and current which includes a body having an input side and an output side. The input and the output side are operable to accept a transmission line carrying electricity. A cavity runs from the input side to the output side of the body. An insulator having a first slit and a second slit cut into its length fills the cavity of the body. An inner conductor located in the center of the insulator extends throughout the length of the insulator, from the input side of the body to the output side of the body. The body has a first aperture that aligns with the first slit of the insulator and a second aperture that aligns with the second slit of the insulator, respectively.

The present invention provides various technical advantages over conventional radio frequency probes. For example, one technical advantage is to provide a precision compact probe for measuring radio frequency voltage, current and phase that operates at the same impedance as a radio frequency generator and its associated transmission line. Another technical advantage is the ability to easily construct and calibrate the probe. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1A:
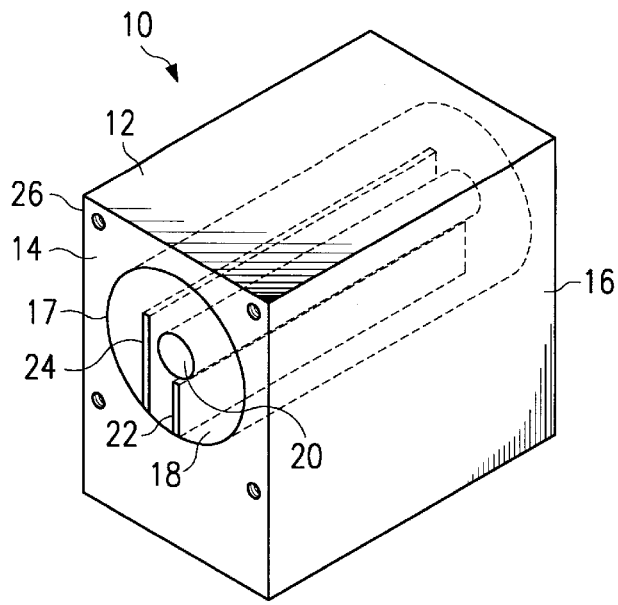
FIG. 1A illustrates a probe.

FIG. 1A illustrates a probe 10 consisting of a main body 12 having an input side 14 and an output side 16. As illustrated, input side 14 and output side 16 are at opposite ends. While this is the case in the exemplary embodiment, other configurations of these sides, or ports, are possible. An insulator 18 fills a cavity 17, bored along an axis of main body 12 from input side 14 to output side 16. In the preferred embodiment, insulator 18 is comprised of Teflon, although it is readily apparent that one skilled in the art may substitute any other suitable insulating material. Within insulator 18, located substantially in the middle of insulator 18 and running along the length of insulator 18 is an inner conductor 20. Inner conductor 20 can be fabricated from the same material as main body 12 or any other conductive material including silver plated brass. Additionally, insulator 18 has slits cut along its length. The first slit, a current slit 22, runs from a side of insulator 18 along roughly a radius of the cross section of insulator 18, toward inner conductor 20 but ending before reaching inner conductor 20. The second slit, a voltage slit 24, runs from a side of insulator 18, through insulator 18, parallel with current slit 22 but following a cord of the cross section to a spot to the side of inner conductor 20. The size and diameter of insulator 18 and inner conductor 20 are chosen to provide the same impedance as that of the transmission line attached to probe 10. This makes probe 10 invisible to the transmission line system and eliminates reflected losses and heat losses.

On both input side 14 and output side 16 are a plurality of mounting screws 26. Mounting screws 26 connect with transmission lines that attach to input side 14 and output side 16 and align their electrical wiring with inner conductor 20. In operation, electricity flows from one transmission line into input side 14, through inner conductor 20, and out of output side 16 to another transmission line.

Figure 1B:
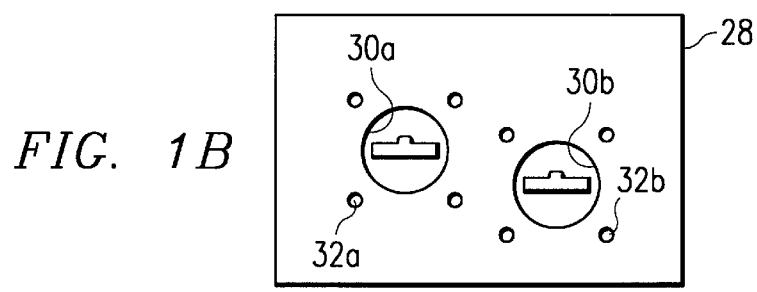
FIG. 1B illustrates another aspect of the probe.

FIG. 1B illustrates another aspect of the probe 10. Probe 10 includes a top side 28 and is the side closest to current slits 22 and voltage slit 24. Along top side 28 are two apertures, a current aperture 30a and a voltage aperture 30b. Current aperture 30a aligns with the current slit 22 while voltage aperture 30b aligns with voltage slit 24. On the surface of top side 28 are mounting receptacles 32a and 32b which allow for the attachment of connectors to apertures 30a and 30b.

Figure 2A:
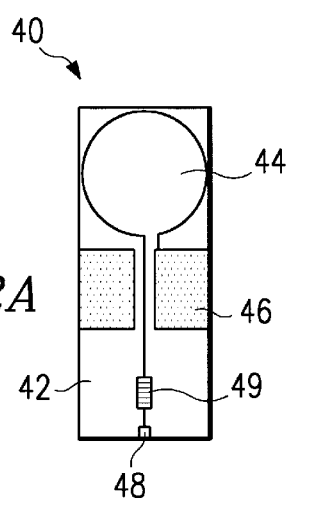
FIG. 2A illustrates a current sensor for the probe.

FIG. 2A illustrates a current sensor 40. Etched onto a mounting surface 42 is a coil of wire 44, metallic pad 46, lead attachment 48, and resistor 49. The coil shape of the coil of wire 44 allows a current to be induced in the coil of wire 44 in the presence of a generated magnetic field such as that induced by electricity flowing through inner connector 20. More than one coil of wire 44 can be used to measure current. Additionally, extra coils can be used to provide shielding. Coil of wire 44 has a low impedance to ground.

Therefore, resistor 49 is usually employed in order to match the impedance of the other probe 10 components. Typically the resistor 49 is a 50 ohm resistor, however, in certain situations, no resistors, different resistors, or even a matching network can be used in place of resistor 49. In the primary embodiment, mounting surface 42 is fabricated from Teflon. Teflon is advantageous because, unlike fiberglass, it is easy to use in the fabrication process. Also, if both mounting surface 42 and the insulator 18 are Teflon, a more accurate current and voltage measurement can be achieved since both insulator 18 and mounting surface 42 would have identical dielectric constants. Of course, while the advantages of Teflon for mounting surface 42 is apparent, other materials, including fiberglass, suitable for use.

In operation, current sensor 40 is inserted into current aperture 30a and into current slit 22. Current sensor 40 penetrates insulator 18 up to the metallic pad 46 which remains in main body 12 of probe 10. Metallic pad 46, when touching the main body 12, provides a ground. A connector with a line out mounted at aperture 30a through mounting receptacle 32a attaches to lead attachment 48 for providing a current measurement to a meter (not shown) which displays the current.

Figure 2B:
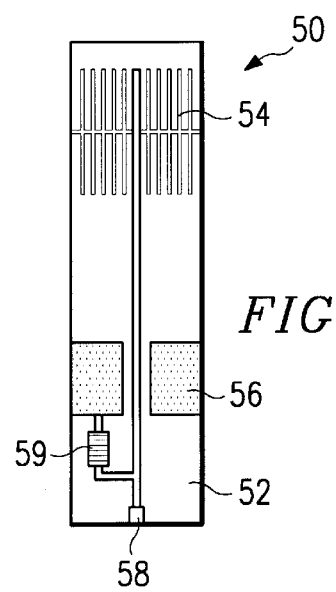
FIG. 2B illustrates a voltage sensor for the probe.

FIG. 2B illustrates a voltage sensor 50 comprising a mounting surface 52, wires 54, metallic pad 56, lead attachment 58 and a resistor 59. Wires 54 are arranged to resemble a pad. In use in an actual system, wires 54 will act like a capacitor and will receive the radio frequency energy in order to generate a voltage signal. Resistor 59 is shunted across the voltage sensor 50 to ground. This helps to match the impedance of the rest of the probe 10 components. Resistor 59 is typically a 50 ohm resistor, however, a different resistor, no resistor or even a matching network can be used depending on sensitivity and frequency requirements. Mounting surface 52 is fabricated of Teflon or some other suitable material.

In operation, voltage sensor 50 inserts into voltage aperture 30b and through voltage slit 24. Voltage sensor 50 penetrates insulator 18 up to metallic pad 56 which remains in main body 12 of probe 10. Metallic pad 56, when touching main body 12, provides a ground. A connector with a line out mounted at aperture 30b through mounting receptacle 32b attaches to lead attachment 58 for providing a voltage measurement to a meter (not shown) which displays the voltage. From the time varying relationship between current and voltage, phase can be determined.

Figure 3:
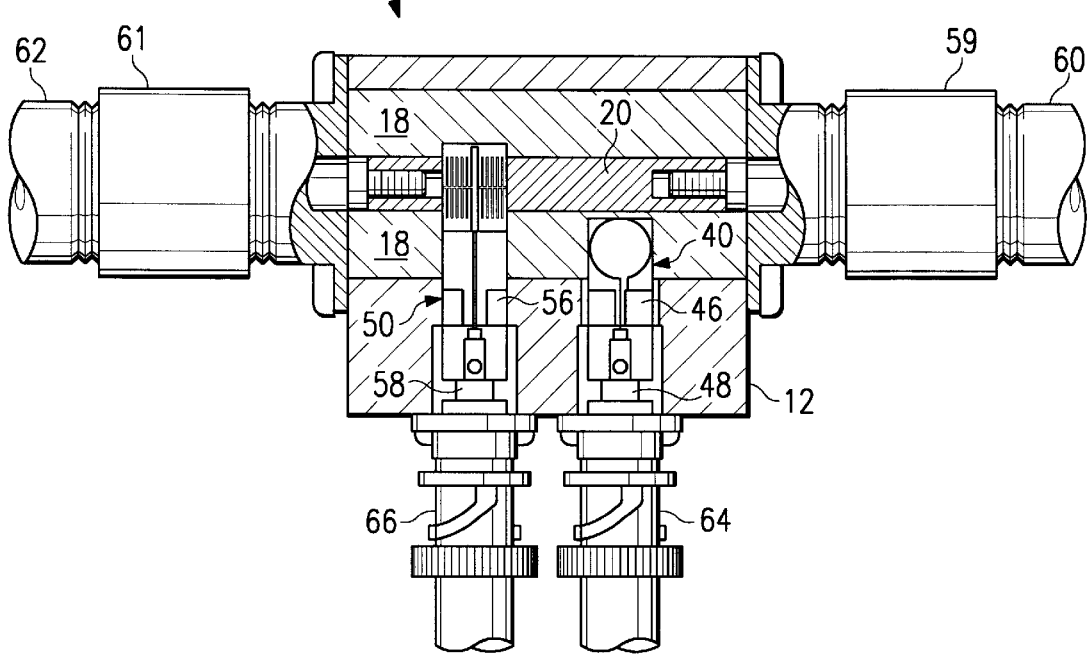
FIG. 3 is a cutaway view of the probe.

FIG. 3 is a cutaway view of the probe 10 with current sensor 40 and voltage sensor 50 attached. In this view, an input connector 59 with input transmission line 60 (illustrated as a coaxial cable with an HN type connector) attaches to input side 14 of main body 12. At the other end, output connector 61 with output transmission line 62 attaches to output side 16 of main body 12. As seen in the illustration, metallic pads 46 and 56 do not extend into insulator 18. Instead, they provide grounding by contacting with main body 12. Attached to current sensor 40 is lead attachment 48 which in turn attaches to current cable 64 which can be a BNC type cable connector as shown or any other suitable connection. Similarly, attached to voltage sensor 50 is attachment lead 58 which in turn attaches to voltage cable 66. Current cable 64 and voltage cable 66 attach to a meter (not shown) to provide a readout of current and voltage measurements. The phase can then be determined from the time varying relationship between current and voltage.

In operation, electricity flows through input transmission line 60. In a primary embodiment, input transmission line 60 is a 50 ohm cable powered by a source operating in the radio frequency. Input transmission line 60 attaches to input side 14 of probe 10 and the electricity flows through inner conductor 20. The magnetic field created by the current flow through inner conductor 20 induces a current flow in coil of wire 44 of current sensor 40. This current is passed via cable 64 to a meter for reading. In the case of voltage sensor 50, wires 54 are spaced close enough together that they resemble a pad. Wires 44 extend over inner conductor 20 and act like a capacitor to receive RF energy. The radio frequency energy detected by voltage sensor 50 is sent via cable 66 to a meter for voltage measurement. The phase can then be calculated based on the current and voltage relationship. Current flow proceeds from the inner conductor 20 to output transmission line 62.

Figure 4:
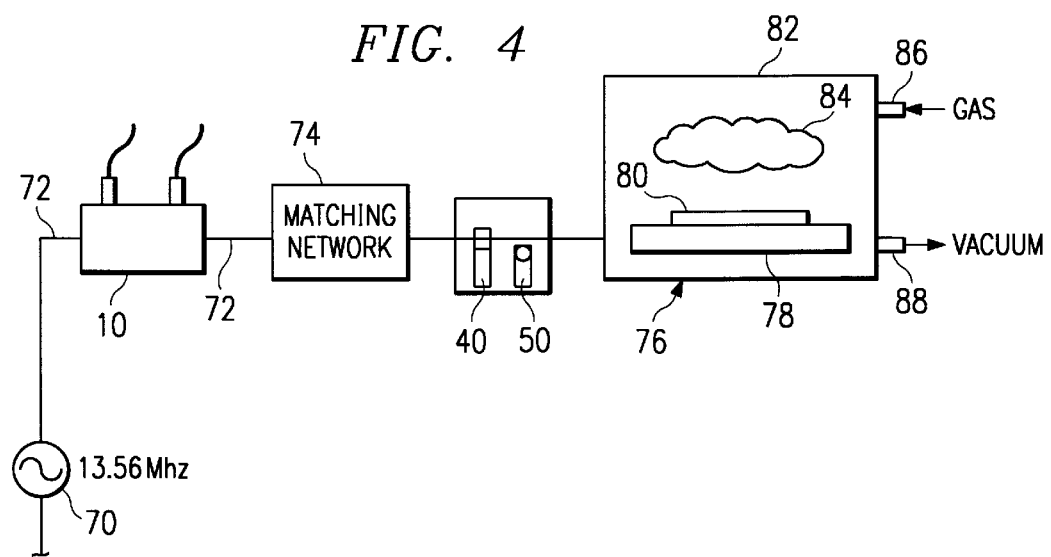
FIG. 4 illustrates a use of the probe in an exemplary system.

FIG. 4 illustrates the use of probe 10 in an exemplary system—a metal etcher. In this system, an RF generator 70, in this case operating at 13.56 MHZ, connects to probe 10 via a 50-ohm coaxial cable 72. Probe 10 connects, also via a 50-ohm coaxial cable, to a matching network 74 which connects to a metal etching chamber 76. Metal etching chamber 76 has a lower electrode 78, a wafer 80, an upper electrode 82, plasma 84, a gas source 86, and a vacuum 88.

In operation, the system operates similar to a typical radio frequency system designed for communications (such as a Ham radio system). RF generator 70 generates a RF signal which is transmitted via the 50-ohm line to matching network 74. The purpose of matching network 74 is to provide an efficient transfer of RF power from RF generator 70 to plasma 84 by matching the different impedances between RF generator 70 and metal etching chamber 76. The RF energy released in metal the etching chamber 76 forms plasma 84 from gas 86 and etches wafer 80. The purpose of probe 10 mounted on the RF generator side of matching network 74 is to monitor current and voltage transmitted through coaxial cable 72.

In order to accurately measure the voltage and current it is desirable to have a detector with an impedance the same as the impedance in the cable. The typical impedance in a transmission line for this system is 50-ohms. Therefore, probe 10 is designed to have an impedance of 50-ohms also, thus creating a probe invisible to the system. Therefore, probe 10, in line between RF generator 70 and matching network 74 monitors the current, voltage, and phase angle of the RF signal. Additionally or alternatively, current sensor 40 and voltage sensor 50 can be mounted between matching network 74 and metal etching chamber 76. In this case, current sensor 40 and voltage sensor 50 can be mounted without the use of main body 12. Main body 12 is not necessary since it is no longer necessary to have a probe of the same impedance as the transmission line. The sensors located near metal etching chamber 76 can measure the voltage and current change across the load which in turn is related to the voltage and current change within the metal etching chamber 76. This information can also be used to refine the etching process.

Thus, it is apparent that there has been provided, in accordance with the present invention, a probe for matching the impedance of a transmission line that satisfies the advantages set forth above. Although the present invention has been described in detail, it should be understood that various changes, substitutions, and alterations readily ascertainable by one skilled in the art can be made herein without departing from the spirit and scope of the present invention as defined by the following claims.

What is claimed is:

1. A probe for monitoring radio frequency voltage and current, comprising:

a body, having an input side and an output side, the input and the output sides for accepting transmission lines carrying electricity, the body having a cavity extending from the input side to the output side;

an insulator extending within the cavity, the insulator having a hole extending therethrough from said input side to said output side, the insulator having a first slit and a second slit therein, each of said first and second slits extending in a direction substantially parallel to said hole, the body having a first aperture aligned with and extending to the first slit, the body having a second aperture aligned with and extending to the second slit;

an inner conductor extending from the input side to the output side within the hole of the insulator; and a current sensor insertable into the first aperture and the first slit, the current sensor measuring the current transmitted through the inner conductor, the current sensor including at least one metallic loop disposed on a circuit board, the at least one metallic loop having a first portion for receiving an induced current and a second portion to provide shielding.

2. The probe of claim 1, wherein the circuit board is fabricated from the same material as the insulator.

3. The probe of claim 1, further comprising a voltage sensor which includes a voltage sensing device, the voltage sensing device insertable into the second aperture and the second slit, the voltage sensor for measuring the voltage transmitted through the inner conductor.

4. The probe of claim 3, wherein the voltage sensing device further comprising a plurality of metallic fingers etched to a circuit board, the metallic fingers for accepting radio frequency voltage.

5. The apparatus of claim 4, wherein the circuit board is fabricated from the same material as the insulator.

6. The probe of claim 3, further comprising a voltage signal cable assembly coupled to the voltage sensor, the voltage signal cable assembly having a BNC type connector.

7. The probe of claim 1, wherein the body and inner conductor fabricated from a conductive material.

8. The probe of claim 1, wherein the insulator is fabricated from Teflon.

9. The probe of claim 1, further comprising a current signal cable assembly coupled to the current sensor, the current signal cable assembly having a BNC type connector.

10. The probe of claim 1, further comprising a transmission line assembly at the input side and the output side, the transmission line assembly having an HN type connector.

11. An apparatus for monitoring radio frequency voltage and current, comprising:

a body, having an input side and an output side, the body having a cavity extending from the input side to the output side;

an HN type connector coupled to the input side and the output side;

an insulator extending within the cavity, the insulator having a hole extending therethrough from said input side to said output side, the insulator having a first slit and a second slit therein, each of said first and second slits extending in a direction substantially parallel to said hole the body having a first aperture and a second aperture, the first aperture aligned with and extending to the first slit, the second aperture aligned with and extending to the second slit;

an inner conductor extending from the input side to the output side within the hole of the insulator;

a current sensor insertable into the first aperture and the first slit to measure the current transmitted through the inner conductor, the current sensor including at least one metallic loop formed on a circuit board, a first portion of the metallic loop operable to receive an induced current and a second portion of the metallic loop providing shielding;

a BNC type connector coupled to the current sensor to output the measured current;

a voltage sensor insertable into the second aperture and the second slit, the voltage sensor for measuring the voltage transmitted through the inner conductor; and a BNC type connector coupled to the voltage sensor to output the measured voltage.

12. The probe of claim 3, wherein the circuit board is fabricated from the same material as the insulator.

13. The probe of claim 11, wherein the voltage sensor further includes at least one metallic finger disposed on a circuit board, the at least one metallic finger accepting radio frequency voltage.

14. The probe of claim 11, wherein the body and the inner conductor are fabricated from silver-plated brass conductive material.

15. The probe of claim 11, wherein the insulator is fabricated from Teflon.

* * * * *